(12) United States Patent
Park

(10) Patent No.: US 7,564,724 B2
(45) Date of Patent: Jul. 21, 2009

(54) FLASH MEMORY DEVICE

(75) Inventor: Jin Su Park, Daegu (KR)

(73) Assignee: Hynix Semiconductor Inc., Icheon-si (KR)

( * ) Notice: Subject to any disclaimer, the term of this patent is extended or adjusted under 35 U.S.C. 154(b) by 235 days.

(21) Appl. No.: 11/618,513

(22) Filed: Dec. 29, 2006

(65) Prior Publication Data

US 2007/0247928 A1    Oct. 25, 2007

(30) Foreign Application Priority Data

Apr. 20, 2006    (KR) .................. 10-2006-0035648

(51) Int. Cl.
*G11C 7/10*    (2006.01)
(52) U.S. Cl. .................. 365/189.05; 365/185.17; 365/185.2; 365/189.09; 365/230.08
(58) Field of Classification Search ............ 365/189.09, 365/185.17, 185.2, 230.08, 189.05
See application file for complete search history.

(56) References Cited

U.S. PATENT DOCUMENTS 6,304,486 B1    10/2001    Yano 6,826,082 B2 *   11/2004   Hwang et al. .......... 365/185.17
7,187,584 B2 *    3/2007   Chang ................... 365/185.17

FOREIGN PATENT DOCUMENTS

| KR | 100187665 B1 | 1/1999 |
|----|--------------|--------|
| KR | 1020050064666 A | 6/2005 |
| KR | 1020060053767 A | 5/2006 |

* cited by examiner

*Primary Examiner*—Pho M. Luu
(74) *Attorney, Agent, or Firm*—Townsend and Townsend and Crew LLP

(57) ABSTRACT

A flash memory device includes a normal memory cell array for storing data, a normal page buffer for inputting data to the normal memory cell array or reading data stored in the normal memory cell array, one or more reference memory cell blocks for storing reference data, one or more reference page buffers for inputting reference data to the reference memory cell blocks or reading reference data from the reference memory cell blocks, and outputting a reference control signal, and one or more latch signal generators for generating first and second latch control signals supplied to the normal page buffer and the reference page buffers in response to the reference control signal. A reference bit line signal is formed using the reference memory cell block, the reference page buffer, and the latch signal generator.

16 Claims, 10 Drawing Sheets

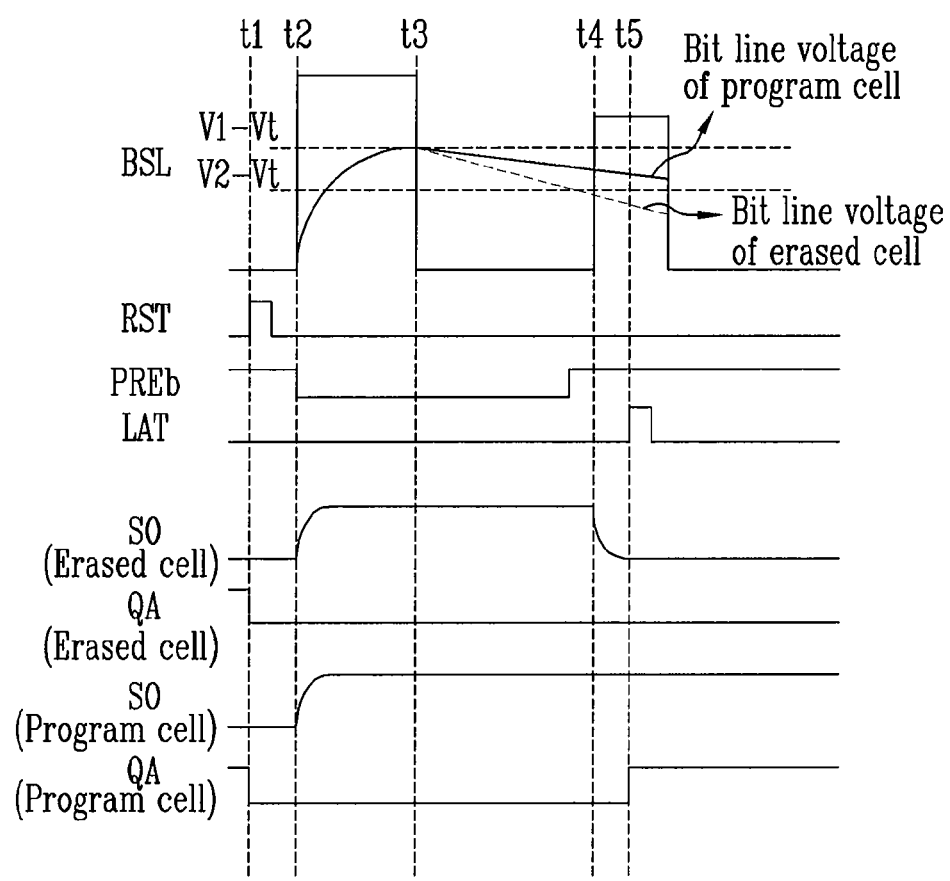

FLASH MEMORY DEVICE

BACKGROUND

The present invention relates to semiconductor memory devices, and more particularly, to flash memory devices that reduce read errors due to leakage current.

In general, semiconductor memory devices are classified into volatile or non-volatile memory devices depending on whether data is retained when the power is turned off. The non-volatile memory device is a memory device that can retain data even after the supply of power is stopped. In recent years, the flash memory device has been in the spotlight. Flash memory can be classified into a NOR or a NAND type memory device. The NAND flash memory device employs read and program methods on a page basis.

The flash memory device includes a memory cell array having a plurality of memory cell strings. The plurality of memory cell strings are connected to a plurality of page buffers through bit lines.

FIG. 1 is a circuit diagram of a conventional flash memory device. Referring to FIG. 1, a memory cell string 10 includes a plurality of memory cells F1 to Fi. A page buffer 20 includes a precharge control element P1, a reset element N1, a bit line select control element N2, a program control element N3, a data output control element N8, a latch circuit 30, a sensing control circuit 40, and a data input control circuit 50.

The read operation of the flash memory device shown in FIG. 1 will be described with reference to FIG. 2. If a reset signal RST is enabled at t1 of FIG. 2, the output signal QA of the page buffer 20 is reset low. If a bit line selection signal BSL is applied with a voltage of V1 (with V1≦Vcc) and a precharge signal PREb is enabled low at t2 of FIG. 2, a bit line BL is precharged to a voltage V1-Vt. If the bit line selection signal BSL is disabled to 0V at t3 of FIG. 2, the bit line BL begins discharging through the leakage current path of the memory cells F1 to Fi and the bit line BL.

In this case, if the selected memory cell is an erased cell, the voltage on the bit line BL is discharged through a selected memory cell string current (Icell) path and a bit line leakage current (Ileak) path. On the other hand, if the memory cell is a programmed cell, the voltage on the bit line BL is discharged through the leakage current (Ileak) path of the bit line BL itself. Furthermore, the leakage current Ileak of the bit line BL is a current flowing through the string of a non-selected block or a junction. As the number of blocks connected to the bit line BL is increased and the temperature rises, the leakage current Ileak of the bit line BL is increased.

If the bit line selection signal BSL is enabled to V2 at t4 of FIG. 2, the voltage of the sensing node SO is discharged through the bit line BL when the voltage passed to the bit line BL is lower than V2-Vt. Accordingly, the output signal QA is kept to an initial value "0" even though the latch control signal LAT is enabled.

Meanwhile, when the voltage applied to the bit line BL is higher than V2-Vt, the voltage of the sensing node SO is not discharged, but is kept at Vcc. Therefore, if the latch signal LAT is enabled, the output signal QA is changed from the initial value "0" to "1".

For a programmed cell, the voltage difference between V1 and V2 must be set such that the voltage applied to the bit line BL is greater than the amount discharged by the leakage current Icell of the cell string. In addition, the voltage difference between V1 and V2 must be set such that when a memory cell is an erased cell, the voltage applied to the bit line BL is smaller than the amount discharged by the cell string current Icell.

When a selected memory cell is a programmed cell, the voltage applied to the bit line BL must be set greater than the amount discharged by the leakage current Ileak. Meanwhile, when a selected memory cell is an erased cell, the voltage applied to the bit line BL must be set smaller than the amount discharged by the sum of the cell string leakage current Icell and the bit line leakage current Ileak. The above relationship can be expressed in the following Equation 1.

$$(Icell+Ileak) \times Cp/Td > V1-V2 > Ileak \times (Cp/Td) \quad \text{[Equation 1]}$$

where Cp is the capacitance of the bit line BL, and Td is a time (t4-t3) at which the bit line BL is discharged.

However, the bit line leakage current Ileak may range from "0" to IleakMAX (the highest value of Ileak) depending on temperature and/or process variation. Accordingly, when considering all parameters, Equation 1 can be expressed in the following Equation 2.

$$Icell \times (Cp/Td) > V1-V2 > IleakMAX \times (Cp/Td) \quad \text{[Equation 2]}$$

Therefore, when the bit line leakage current Ileak is higher than the leakage current Icell of the cell string, the sensing margin is significantly reduced.

FIGS. 3a and 3b are timing diagrams illustrating variation in the voltage of the bit line depending on the amount of the bit line leakage current during the read operation of the conventional flash memory device. As shown in FIG. 3a, the bit line voltage of the erased cell is set so that it is discharged to the voltage V1-Vt or less. When the selected cell is a programmed cell and the bit line current is low, the bit line voltage is higher than V2-Vt at the time of the read operation, as indicated by the curve A1. When the selected cell is an erased cell, the bit line voltage is lower than V2-Vt as indicated by the curve C1.

However, if the bit line leakage current is increased, the bit line voltage of the program cell may become lower than V2-Vt (refer to a curve A2) as shown in FIG. 3b. In other words, a problem occurs because the selected cell can be read as an erased cell due to the leakage current although the selected cell is a programmed cell.

SUMMARY OF THE INVENTION

An embodiment of the present invention relates to a flash memory device that can reduce read errors caused by leakage current.

A flash memory device according to an embodiment of the invention includes a normal memory cell array for storing data; a normal page buffer for inputting data to the normal memory cell array or reading data stored in the normal memory cell array; one or more reference memory cell blocks for storing reference data; one or more reference page buffers for inputting reference data to the reference memory cell blocks or reading reference data from the reference memory cell blocks, and outputting a reference control signal; and one or more latch signal generators for generating first and second latch control signals supplied to the normal page buffer and the reference page buffers in response to the reference control signal.

In one embodiment, a flash memory device includes a memory cell array to store data; a page buffer to input data to the memory cell array or read data stored in the memory cell array; a reference memory cell block to store reference data; a reference page buffer to input reference data to the reference memory cell block or read reference data from the reference memory cell block, the reference page buffer configured to output a reference control signal; and a latch signal generator to generate first and second latch control signals supplied to the page buffer and the reference page buffer in response to the reference control signal.

In anther embodiment, a flash memory device includes a memory cell array to store data, the memory cell array including a drain select transistor coupled to a bit line and a first memory cell having a first gate terminal that is connected to a first word line; a page buffer to input data to the memory cell array or read data stored in the memory cell array; and a reference memory cell block to store reference data, the reference memory cell block including a reference drain select transistor coupled to a reference bit line and a first reference memory cell having a first gate terminal coupled to the first word line. The reference memory cell block is configured to provide a reference voltage that changes as a bit line voltage changes.

BRIEF DESCRIPTION OF THE DRAWINGS

FIG. 2 is a timing diagram illustrating the read operation of the flash memory device shown in FIG. 1;

DETAILED DESCRIPTION OF EMBODIMENTS

The present invention will be described in detail in connection with certain embodiments. A more complete appreciation of the invention, and many of the attendant advantages thereof, will be readily apparent and better understood by reference to the following detailed description when considered in conjunction with the accompanying drawings in which like reference symbols indicate the same or similar components.

Figure 1:
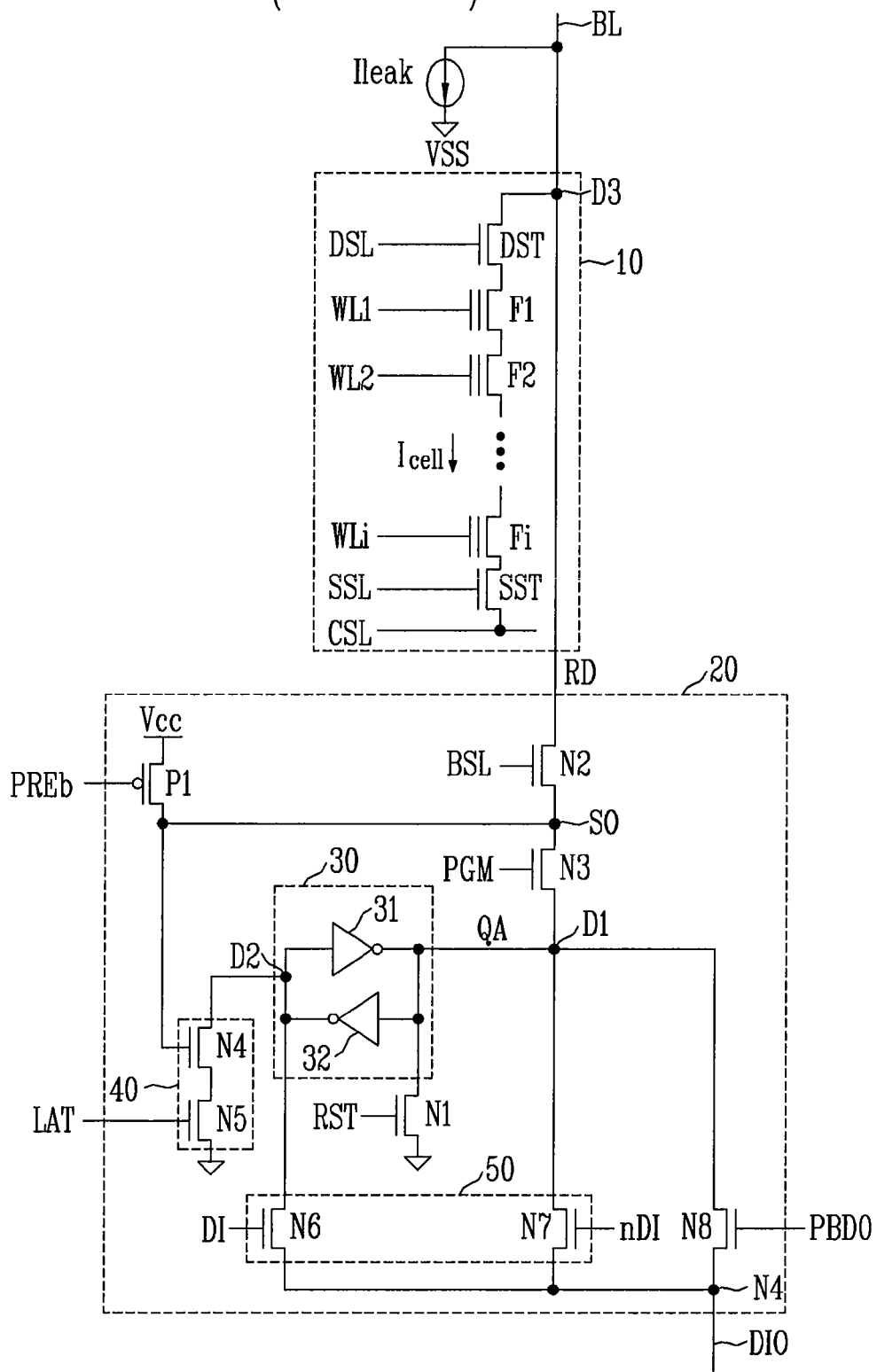
FIG. 1 is a circuit diagram of a conventional flash memory device.
Figure 3A:
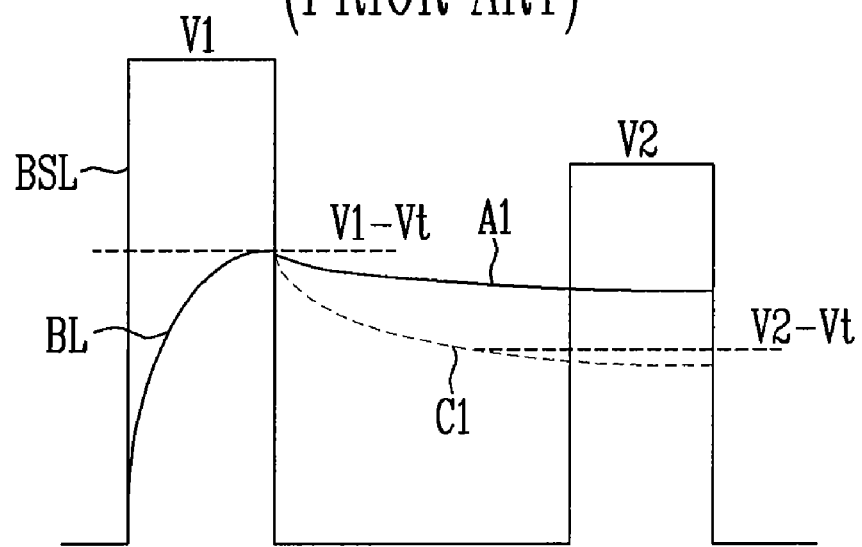
FIGS. 3a and 3b are timing diagrams illustrating variation in the voltage of the bit line depending on an amount of the leakage current of the bit line during the read operation of the conventional flash memory device.
Figure 3B:
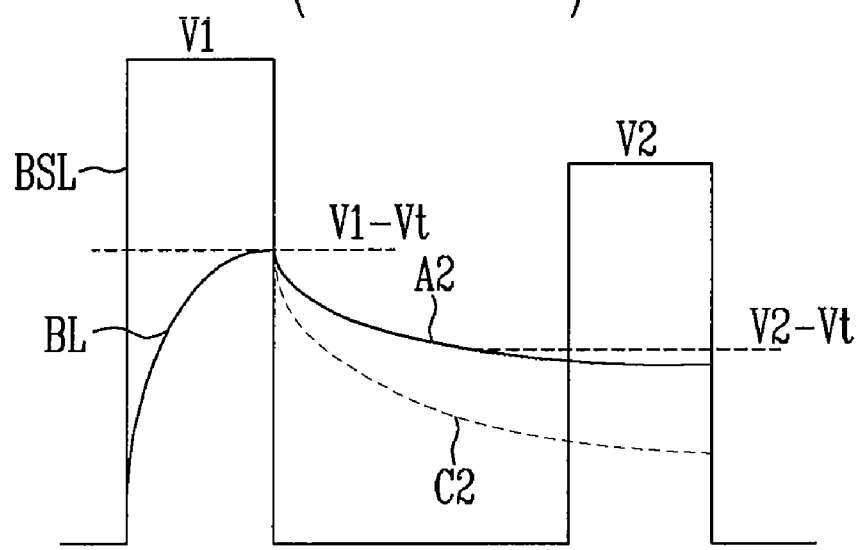
Figure 4:
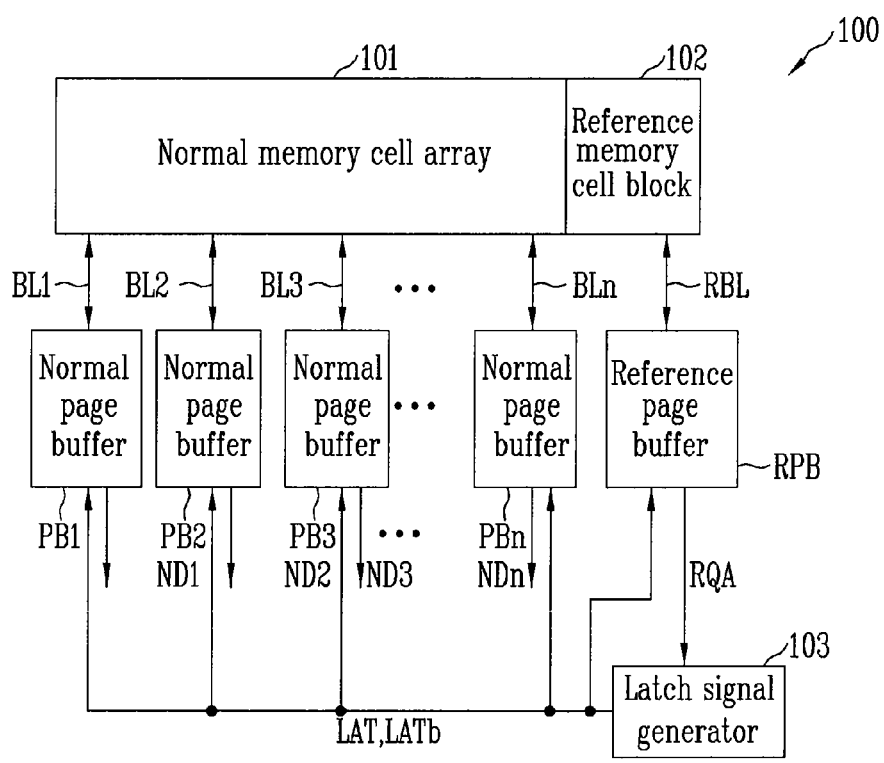
FIG. 4 is a schematic block diagram of a flash memory device according to a first embodiment of the present invention.

Referring to FIG. 4, according to a first embodiment of the present invention a flash memory device 100 includes a normal memory cell array 101, a reference memory cell block 102, a plurality of normal page buffers PB1 to PBn (where n is an integer), a reference page buffer RPB, and a latch signal generator 103.

The normal memory cell array 101 includes normal memory cells for storing data. One or more reference memory cell blocks 102 store reference data. The plurality of normal page buffers PB1 to PBn serve to input data to the normal memory cell array 101 or read data stored in the normal memory cell array 101. One or more reference page buffers RPB serve to input reference data to the reference memory cell block 102 or read reference data from the reference memory cell block 102 and output a reference control signal RQA. One or more latch signal generators 130 generate first and second latch control signals LATb, LAT, which will be provided to the plurality of normal page buffers PB1 to PBn and the reference page buffer RPB, in response to the reference control signal RQA. The first and second latch signals LATb, LAT are enabled at the time of read.

Figure 5:
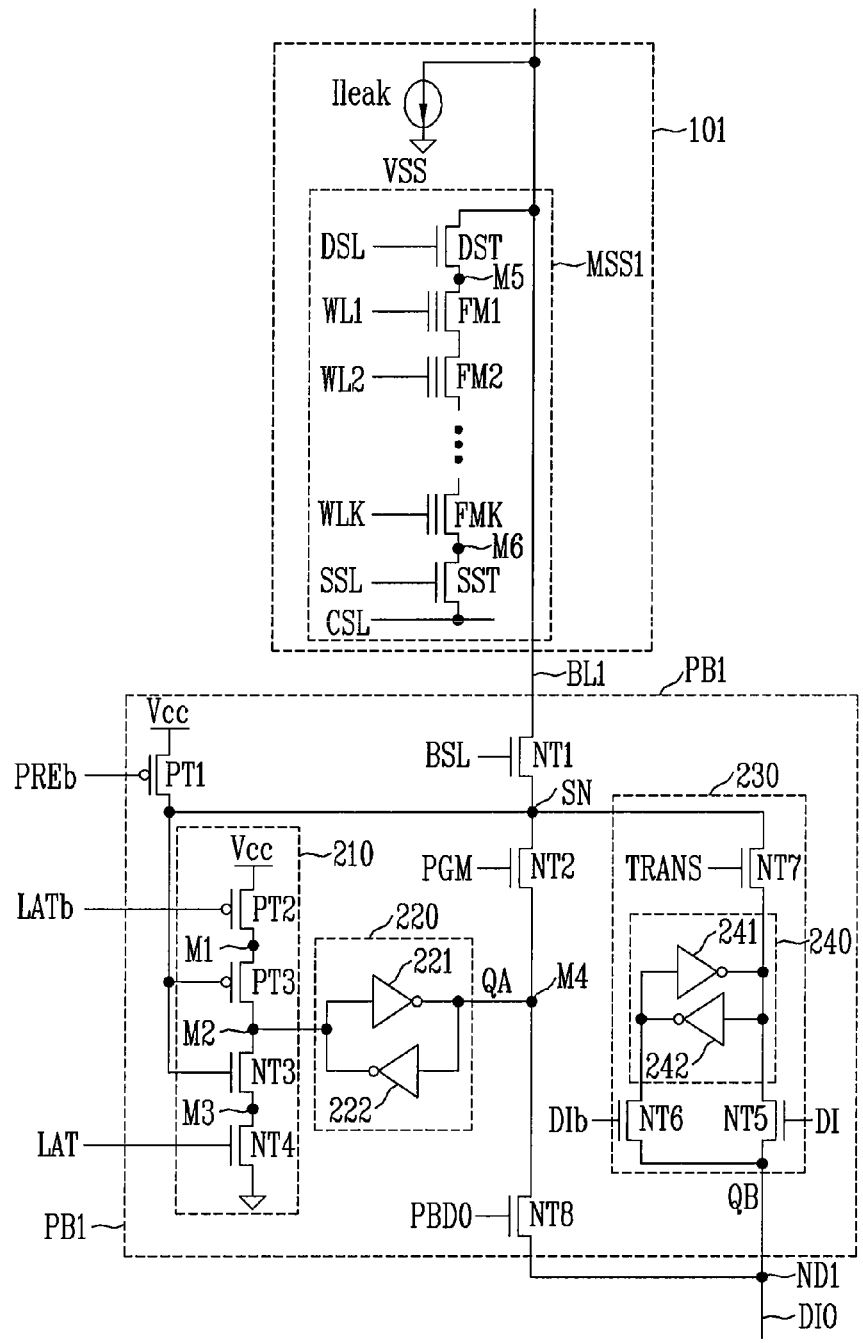
FIG. 5 is a circuit diagram illustrating a normal page buffer shown in FIG. 4.

Referring to FIG. 5, the normal page buffer PB1 is connected to the normal memory cell array 101 through a bit line BL1. The normal memory cell array 101 includes a normal memory cell string MSS1. The normal memory cell string MSS1 includes a drain select control element DST, a plurality of memory cells FM1 to FMk, a source select control element SST, and a common source line CSL.

The drain select control element DST is connected between the bit line BL1 and the fifth node M5 and operates in response to a drain select control signal DSL. The plurality of reference memory cells FM1 to FMk are connected in series between the fifth node M5 and the sixth node M6 and are selected with word line signals WL1 to WLk, respectively. The reference source select control element SST is turned on or off by the source select signal SSL and connects the sixth node M6 and the common source line CSL.

The normal page buffer PB1 includes a precharge control element PT1, a bit line select control element NT1, a program control element NT2, a data output control element NT8, a sensing control circuit 210, a first latch circuit 220, and an input control circuit 230.

The precharge control element PT1 may be implemented using a PMOS transistor. The precharge control element PT1 serves to pass a power supply voltage (Vcc) to a sensing node SN in response to a precharge signal PREb.

The bit line select control element NT1 may be implemented using a NMOS transistor. The bit line select control element NT1 serves to connect the bit line BL1 to the sensing node SN in response to a bit line select control signal BSL. The bit line select control element NT1 is turned on when the bit line select control signal BSL is enabled high. The bit line select control element NT1 passes read data to the sensing node SN during a read operation and passes program data to the bit line BL1 during a program operation.

The program control element NT2 may be implemented using a NMOS transistor. The program control element NT2 connects the sensing node SN and a fourth node M4 in response to a program control signal PGM.

The data output control element NT8 may be implemented using a NMOS transistor. The data output control element NT8 connects the fourth node M4 and an I/O line DIO in response to a data output control signal PBDO.

The sensing control circuit 210 operates according to the first and second latch control signals LATb, LAT and the potential of the sensing node SN. The sensing control circuit 210 includes second and third PMOS transistors PT2, PT3, and third and fourth NMOS transistors NT3, NT4. The second PMOS transistor PT2 passes the power supply voltage (Vcc) to the first node M1 in response to the first latch control signal LATb. The third PMOS transistor PT3 passes the potential of the first node M1 to a second node M2 according to the potential of the sensing node SN. The third NMOS transistor NT3 connects the second node M2 and a third node M3 according to the potential of the sensing node SN. The fourth NMOS transistor NT4 connects the third node M3 to ground (Vss) in response to the second latch control signal LAT.

The first latch circuit 220 latches a voltage applied to the second node M2 and outputs an output signal QA.

The input control circuit 230 includes fifth and sixth NMOS transistors NT5, NT6, a second latch circuit 240, and an input transfer control element NT7. The fifth NMOS transistor NT5 connects the I/O line DIO and the second latch circuit 240 in response to an input control signal DI. The sixth NMOS transistor NT6 is connected in parallel to the fifth NMOS transistor NT5 and connects the I/O line DIO and the second latch circuit 240 in response to a second input control signal DIb. The first input control signal DI and the second input control signal DIb are inverted signals of each other. The second latch circuit 240 latches signals passed through the fifth or sixth NMOS transistors NT5, NT6. The input transfer control element NT7 connects the second latch circuit 240 and the sensing node SN in response to a transfer signal TRANS.

Figure 6:
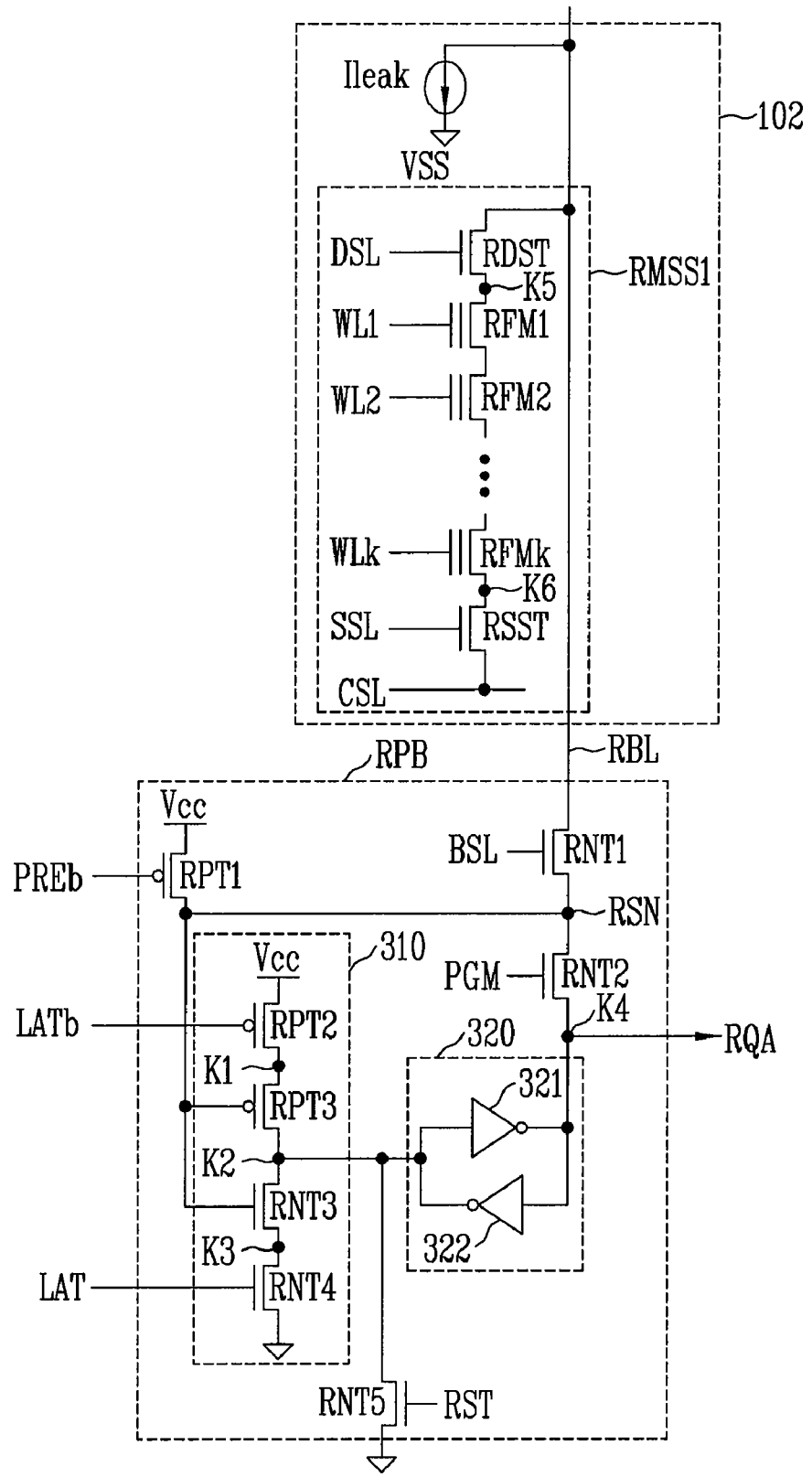
FIG. 6 is a circuit diagram illustrating a reference memory cell block and a reference page buffer shown in FIG. 4.

Referring to FIG. 6, the reference memory cell block 102 is connected to the reference page buffer RPB through a reference bit line RBL. The reference memory cell block 102 includes a reference memory cell string RMSS1. The reference memory cell string RMSS1 includes a reference drain select control element RDST, a plurality of reference memory cells RFM1 to RFMk, and a reference source select control element RSST. The reference drain select control element RDST is connected between the reference bit line RBL and a fifth node K5 and is turned on or off in response to the drain select control signal DSL. The plurality of reference memory cells RFM1 to RFMk are connected in series between the fifth node K5 and a sixth node K6 and are controlled according to the word line signals WL1 to WLk, respectively. The reference source select control element RSST is connected between the sixth node K6 and the common source line CSL and is turned on or off in response to the source select signal SSL.

The reference page buffer RPB includes a reference precharge control element RPT1, a reference bit line select control element RNT1, a reference program control element RNT2, a reference reset control element RNT5, a reference sensing control circuit 310, and a reference latch circuit 320.

The reference precharge control element RPT1 may be implemented using a PMOS transistor. The reference precharge control element RPT1 passes the power supply voltage (Vcc) to a reference sensing node RSN in response to a precharge signal PREb. The reference precharge control element RPT1 is turned on when the precharge control signal PREb is enabled low and passes the power supply voltage (Vcc) to the reference sensing node RSN.

The reference bit line select control element RNT1 connects the reference bit line RBL and the reference sensing node RSN in response to the bit line select control signal BSL. The reference bit line select control element RNT1 passes read data to the reference sensing node RSN during a read operation and passes program data to the reference bit line RBL during a program operation.

The reference program control element RNT2 may be implemented using a NMOS transistor. The reference program control element RNT2 connects the reference sensing node RSN and a fourth node K4 in response to a program control signal PGM. The reference program control element RNT2 is turned on when the program signal PGM is enabled high during a program operation, thereby passing reference output signal RQA from the reference latch circuit 320 to the reference sensing node RSN.

The reference reset control element RNT5 may be implemented using a NMOS transistor. The reference reset control element RNT5 resets the reference latch circuit 320 in response to a reset signal RST.

The reference sensing control circuit 310 includes second and third PMOS transistors RPT2, RPT3, and third and fourth NMOS transistors RNT3, RNT4. The second PMOS transistor RPT2 passes the power supply voltage (Vcc) to a first node K1 in response to the first latch control signal LATb. The third PMOS transistor RPT3 passes the potential of the first node K1 to a second node K2 according to the potential of the reference sensing node RSN. The third NMOS transistor RNT3 connects the second node K2 and a third node K3 according to the potential of the reference sensing node RSN. The fourth NMOS transistor RNT4 connects the third node K3 to the ground (Vss) in response to the second latch control signal LAT. The reference latch circuit 320 latches a signal generated from the reference sensing control circuit 310 and outputs the reference control signal RQA.

Figure 7:
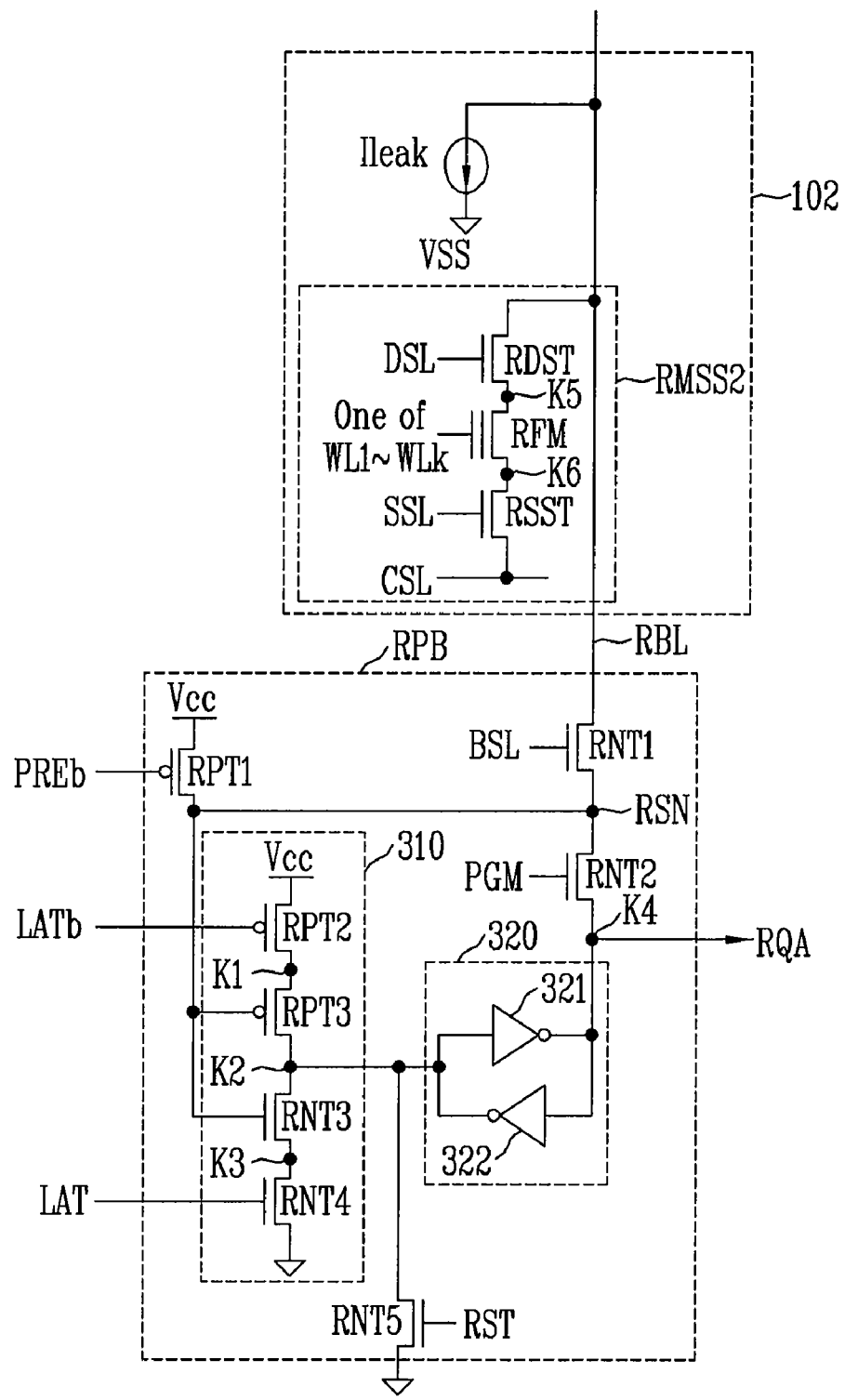
FIG. 7 is another circuit diagram illustrating a reference memory cell block and a reference page buffer shown in FIG. 4.

Referring to FIG. 7, a reference memory cell string RMSS2 includes a reference drain select control element RDST, one reference memory cell RFM, a reference source select transistor RSST, and a common source line CSL.

The reference drain select control element RDST is connected between a reference bit line RBL and a fifth node K5 and is turned on or off in response to the drain select control signal DSL. The reference memory cell RFM is connected between the fifth node K5 and a sixth node K6 and operates in response to a word line signal (one of WL1 to WLk).

The reference source select control element RSST is connected between the sixth node K6 and the common source line CSL and is turned on or off in response to a source select signal SSL. The construction and operation of the reference page buffer RPB are the same as those shown in FIG. 6 and, therefore, will not be described for simplicity.

Figure 8:
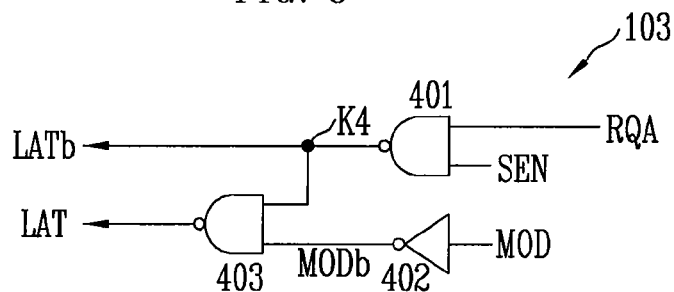
FIG. 8 is a detailed circuit diagram of a latch signal generator shown in FIG.4.

Referring to FIG. 8, the latch signal generator 103 includes first and second NAND gates 401, 403 and an inverter 402. The first NAND gate 401 outputs the first latch control signal LATb in response to the reference control signal RQA and a sensing signal SEN. The inverter 402 inverts a detection signal MOD. The sensing signal SEN and detection signal MOD are generated from a chip. These signals SEN and MOD are controlled by a controller (not shown) in the chip. The second NAND gate 403 outputs the second latch control signal LAT in response to the first latch control signal LATb and an inverted detection signal MODb. There may be more than one of the reference memory cell block 102, the reference page buffer RPB, and the latch signal generator 103. Due to this, the latch control signals LATb, LAT output from the respective latch signal generators 103 can be output at different points of time, thereby minimizing the influence between the circuits.

Figure 9:
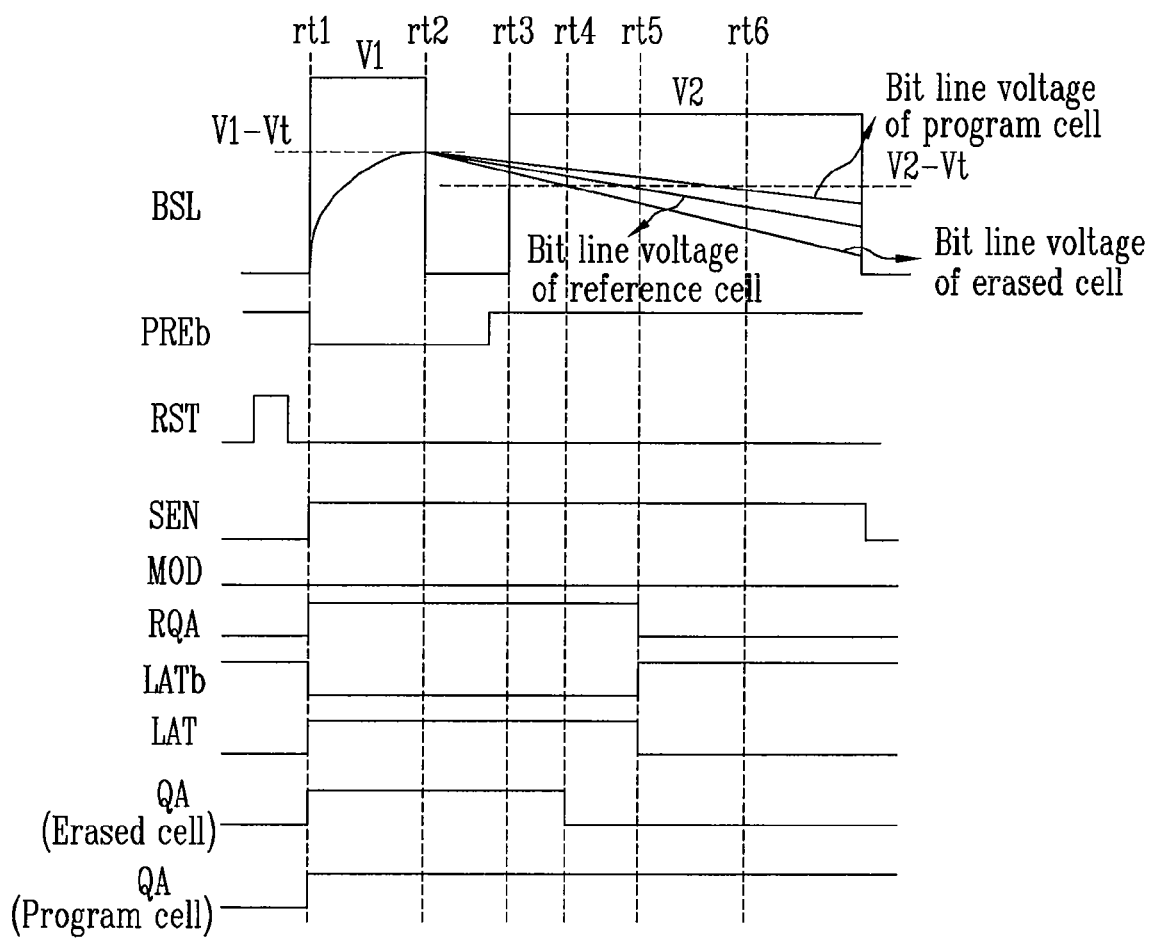
FIG. 9 is a timing diagram illustrating the read operation of the flash memory device shown in FIG. 4.

Referring to FIG. 9, illustrating the read operation, all signals can be shared in the normal page buffers PB1 to PBn and the reference page buffer RPB. At rt1, the bit line selection signal BSL is enabled to a voltage V1 and the precharge signal PREb is disabled low. Voltages applied to the entire bit lines BL are precharged up to a voltage V1-Vt. At this time, if the sensing signal SEN is enabled, the latch control signals LATb, LAT become high and low, respectively, so that both the output signal QA and the reference control signal RQA becomes high.

If the bit line selection signal BSL is disabled at rt2, a voltage on the bit line BL is discharged by the bit line leakage current Ileak in the case of a programmed cell. In the case of an erased cell, a voltage on the bit line BL is discharged by the sum of the bit line leakage current Ileak and the leakage current Icell of the memory cell string. In the case of a referenced cell, a voltage on the bit line BL is discharged by the sum of the reference bit line leakage current Iref and the bit line leakage current Ileak.

If the bit line selection signal BSL is enabled to a voltage V2 (rt3) and a voltage applied to the bit line BL connected to an erased cell reaches V2-Vt (rt4), a voltage applied to the sensing node SN is discharged. Accordingly, the output signal QA is changed from high to low.

At rt5, the reference bit line RBL connected to the reference memory cell string RMSS1 is discharged by the reference bit line leakage current Iref and the bit line leakage current Ileak. Accordingly, a voltage applied to the reference sensing node RSN is discharged, so that the reference output signal RQA is changed from high to low. At this time, the latch control signals LAT, LATb become low and high, respectively, so that further sensing is not performed.

At rt6, although the bit line BL is discharged to the voltage V2-Vt or less by means of the bit line leakage current Ileak, the output signal QA is kept high. If the potential of the reference bit line RBL is changed to low by means of the reference memory cell, sensing is stopped. At this time, the difference between the voltages V1 and V2 of the bit line BL is set greater than the potential of the bit line BL, which is discharged by the memory cell the leakage current Icell, regardless of the bit line leakage current Ileak.

Figure 10:
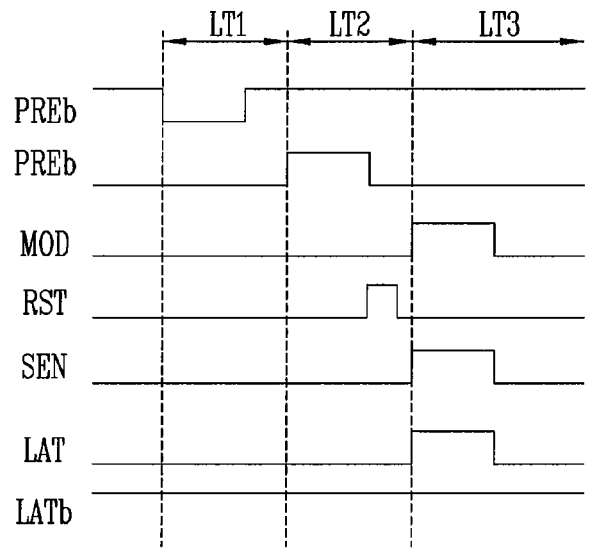
FIG. 10 is a detailed timing diagram illustrating the program operation of the flash memory device shown in FIG. 4.

Referring to FIG. 10, in a period LT1, if the precharge signal PREb is disabled low, the precharge control element PT1 is turned on and the sensing node SN is precharged. In a period LT2, if the transfer signal TRANS is enabled, the input transfer control element NT7 is turned on. Accordingly, input data QB is passed to the sensing node SN. An example in which the input data QB is high and an example in which the input data QB is low will be described below.

When the input data QB is high, the potential of the sensing node SN becomes high, the third PMOS transistor PT3 is turned off, and the third NMOS transistor NT3 is turned on. The reference reset control element RNT5 is turned on when the reset signal RST is enabled and resets the potential of the node K2 to low. Therefore, the reference control signal RQA is output as high by means of the reference latch circuit 320. The first latch control signal LATb is kept high by means of the reference output signal RQA and the sensing signal SEN and the second latch control signal LAT is changed to high by means of the first latch control signal LATb and the detection signal MOD. The fourth NMOS transistor NT4 is turned on when the second latch control signal LAT is enabled high and the potential of the node M2 becomes low. Accordingly, the output signal QA becomes high by means of the first latch circuit 220.

When the input data QB is low, the sensing node SN becomes low, the third PMOS transistor PT3 is turned on, and the fourth NMOS transistor NT4 is turned off. The reference reset control element RNT5 is turned on when the reset signal RST is enabled and resets the potential of the node K2 to low. Accordingly, the reference control signal RQA=high is output by means of the reference latch circuit 320. The first latch control signal LATb is kept high by means of the reference control signal RQA and the sensing signal SEN and the second latch control signal LAT is changed to high by means of the first latch control signal LATb and the control signal MOD. The second NMOS transistor NT4 of the sensing control circuit 210 is turned on because the second latch control signal LAT is enabled high. However, since the third sensing control element NT3 has been turned off, the second node M2 is not influenced. Accordingly, the output signal QA is kept low.

After the operation, the program control element NT2 is turned on when the program signal PGM is enabled, and the output signal QA is passed to the sensing node SN. The bit line select control element NT1 is turned on when the bit line selection signal BSL is enabled high. The voltage of the sensing node SN is passed through the bit line select control element NT1 and then output to the bit line BL1. The voltage of the bit line BL1 is input into the normal memory cell array.

Figure 11:
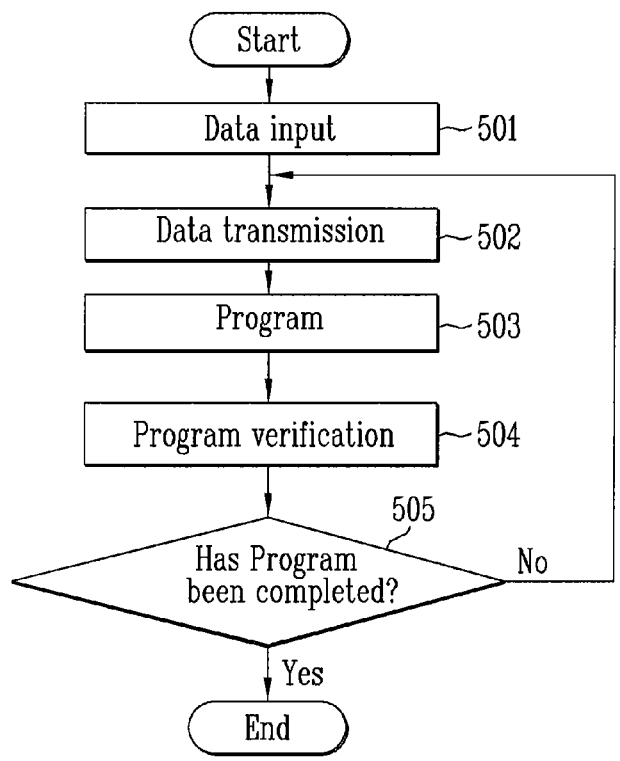
FIG. 11 is a flowchart illustrating the program process of the flash memory device shown in FIG. 4.

Referring to FIG. 11, the program process of the flash memory device includes a data input process 501, a data transmission process 502, a program process 503, a program verification process 504, and a program completion process 505. Each of the processes will be described in detail below.

(a) Data Input Process (Step 501 in FIG. 11)

The first and second input elements NT5, NT6 are turned on in response to the input control signals DI, nDI. As the first and second input elements NT5, NT6 are turned on, the input data QB are latched.

(b) Data Transmission Process (Step 502 in FIG. 11)

As the precharge signal PREb is disabled low, the precharge control element PT1 is turned on and the sensing node SN is precharged. If the transfer signal TRANS is enabled high, the input transfer control element NT7 is turned on and the input data QB is transmitted to the sensing node SN.

(c) Program Process (Step 503 in FIG. 11)

If the sensing control circuit 210 is applied with the first and second latch control signals LAT=high, LATb=low , a voltage applied to the node M2 is transmitted to the first latch circuit 220, which in turn outputs the output signal QA.

(d) Program Verification Process (Step 504 in FIG. 11)

The precharge control element PT1 is turned on when the precharge signal PREb is disabled low. Accordingly, the sensing node SN is precharged. If the transfer signal TRANS is enabled high, the input transfer control element NT7 is turned on and a logic level value of the input data QB is applied to the sensing node SN. In other words, if the input data QB is high, the sensing node SN is set high. If the input data QB is low, the sensing node SN is set low. At this time, if the control signal MOD is enabled in the latch signal generator 103, the second latch control signal LAT becomes high.

In the case where the input data QB is high, if the second latch control signal LAT is enabled in the sensing control circuit 210, both the NMOS transistors NT3, NT4 are turned on. Accordingly, the output signal QA always goes high. Meanwhile, when the input data QB is low, the third sensing control element NT3 is turned off and the output signal QA is kept unchanged.

(e) Program Completion Process (Step 505 in FIG. 11)

If the output signal QA is output high, the program operation is stopped. When the output signal QA is not high, a next program operation begins.

Figure 12:
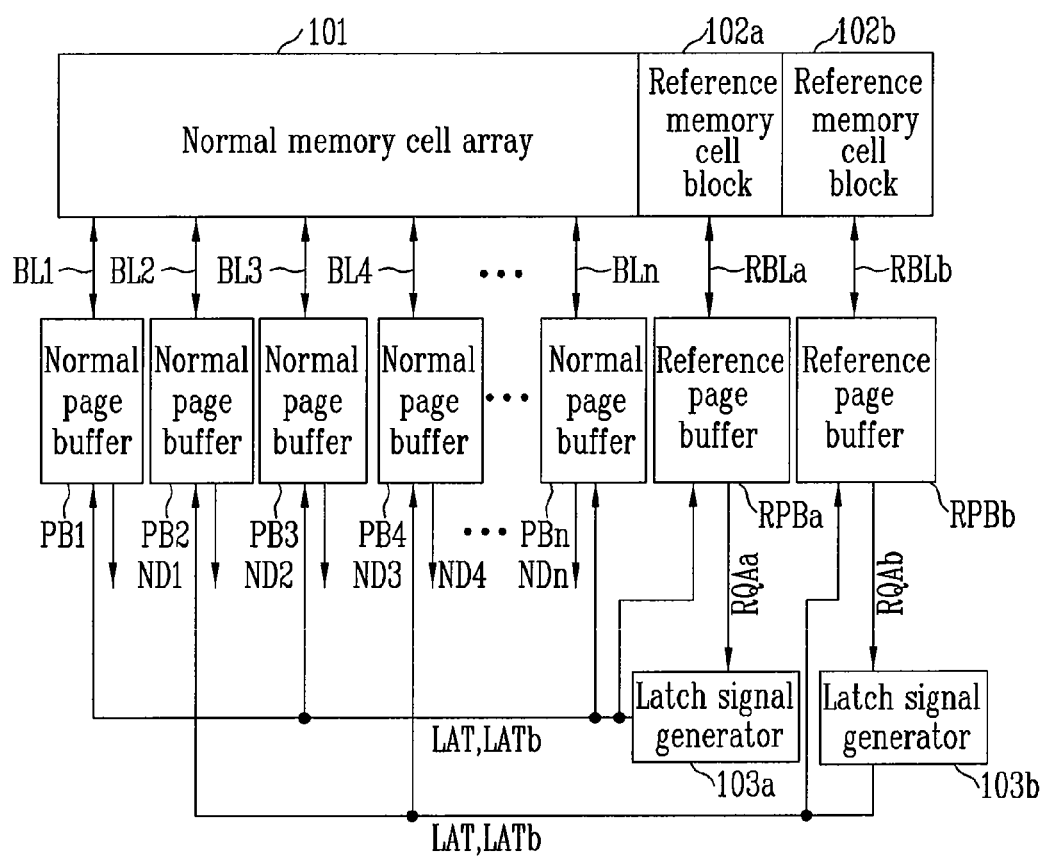
FIG. 12 is a schematic block diagram of a flash memory device according to a second embodiment of the present invention.

Referring to FIG. 12, according to a second embodiment of the present invention, a flash memory device 100 includes a normal memory cell array 101, a plurality of reference memory cell blocks 102a, 102b, a plurality of normal page buffers PB1 to PBn, a plurality of reference page buffers RPBa, RPBb, and a plurality of latch signal generators 103a, 103b.

The normal memory cell array 101 is connected to the plurality of normal page buffers PB1 to PBn through bit lines BL1 to BLn. The normal memory cell array 101 outputs read data or receives program data at the time of a read or program operation. Each of the normal page buffers PB1 to PBn outputs program data to the normal memory cell array 101 at the time of a program operation and receives read data from the normal memory cell array 101 at the time of a read operation.

Each of the reference memory cell blocks 102a, 102b includes a plurality of reference memory cell strings. Each of the plurality of reference memory cell strings includes cells having an amount of leakage current, which is lower than that of a normal erased cell.

The reference page buffers RPBa, RPBb output reference control signals RQAa, RQAb to the latch signal generators 103a, 103b, respectively. Each of the latch signal generators 103a, 103b outputs first and second latch control signals LATb, LAT in response to the reference control signals RQAa, RQAb. Each of the latch signal generators 103a, 103b can output the first and second latch control signals LATb, LAT at predetermined intervals. This is done to minimize the influence between high-integrated circuits.

As described above, in accordance with the flash memory device according to the present invention, the reference control signal is generated using the reference memory cell block and the reference page buffer. The latch signal generator generates latch control signals, which are provided to each page buffer, in response to the reference control signal. Program and read operations are controlled by the latch control signal. Accordingly, the reliability of the flash memory device can be improved.

While the invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A flash memory device comprising:
    a memory cell array to store data;
    a page buffer to input data to the memory cell array or read data stored in the memory cell array through a selected bit line;
    a reference memory cell block to store reference data;
    a reference page buffer to input reference data to the reference memory cell block or read reference data from the reference memory cell block through a reference bit line, the reference page buffer configured to output a reference control signal; and
    a latch signal generator to generate first and second latch control signals supplied to the page buffer and the reference page buffer in response to the reference control signal.

2. The flash memory device of claim 1, wherein the device including a plurality of reference memory blocks, a plurality of reference page buffers, and a plurality of latch signal generator.

3. The flash memory device of claim 1, wherein the page buffer comprises:
    a precharge control element to transfer a power supply voltage to a sensing node in response to a precharge signal;
    a bit line select control element to connect a bit line to the sensing node in response to a bit line select control signal;
    a sensing control circuit that operates according to the first and second latch control signals;
    a program control element to connect the sensing node and a first node in response to a program control signal;
    a first latch circuit connected between the sensing control circuit and the first node;
    an input control circuit connected between an I/O line and the sensing node; and
    a data output control element for connecting the first node and the I/O line according to a data output control signal.

4. The flash memory device of claim 3, wherein the sensing control circuit comprises:
    a first PMOS transistor to transfer the power supply voltage to the first node in response to the first latch control signal;
    a second PMOS transistor to transfer the potential of the first node to a second node according to the potential of the sensing node;
    a third NMOS transistor to connect the second node and a third node according to the potential of the sensing node; and
    a fourth NMOS transistor to connect the third node to a ground in response to the second latch control signal.

5. The flash memory device of claim 3, wherein the sensing control circuit includes at least first and second transistors that are configured to receive the first and second latch control signals, respectively, to output a signal to the first latch circuit.

6. The flash memory device of claim 5, wherein the third and fourth transistors provided between the first and second transistor and having control terminals that are coupled to the sensing node.

7. The flash memory device of claim 3, wherein the input control circuit comprises:
    a second latch circuit to latch data transferred from the I/O line; and
    an input transfer control element to transfer data latched in the second latch circuit to the sensing node in response to a transfer signal.

8. The flash memory device of claim 1, wherein the page buffer comprises:
    a precharge control element to transfer a power supply voltage to a sensing node in response to a precharge signal;
    a bit line select control element to connect a bit line to the sensing node in response to a bit line select control signal; and
    a sensing control circuit including first and second transistors that receive the first and second latch control signals, respectively, to output a given signal.

9. The flash memory device of claim 1, wherein the reference memory cell block comprises:
    a reference drain select control element coupled to a reference bit line and is driven in response to a drain select control signal;
    a reference source select control element coupled to a common source line and is driven in response to a source select signal; and
    at least one reference memory cell that is provided between the reference drain select control element and the reference source select control element and is driven according to a word line signal.

10. The flash memory device of claim 1, wherein the reference memory cell block includes a plurality of reference memory cells that are connected in series and provided between the reference drain control element and the reference source select control element.

11. The flash memory device of claim 1, wherein the reference page buffer comprises:
    a reference precharge control element to transfer a power supply voltage to a reference sensing node in response to a precharge signal;
    a reference bit line select control element to connect a reference bit line and a reference sensing node in response to a bit line select control signal;
    a reference sensing control circuit driven according to the first and second latch control signals and a potential of the reference sensing node;

a reference latch circuit to connect the reference sensing node and a first reference node in response to a program control signal;

a reference latch circuit connected between the reference sensing control circuit and the first reference node, for outputting the reference control signal; and a reference reset element to reset the reference sensing control circuit and the reference latch circuit in response to a reset signal.

12. The flash memory device of claim 11, wherein the reference sensing control circuit comprises:

a first PMOS transistor to transfer a power supply voltage to a first node in response to the first latch control signal;

a second PMOS transistor to transfer the potential of the first node to a second node according to the potential of the reference sensing node;

a first NMOS transistor to connect the second node and a third node according to the potential of the reference sensing node; and a second NMOS transistor to connect the third node to a ground in response to the second latch control signal.

13. The flash memory device of claim 1, wherein the reference page buffer includes a reference sensing control circuit that is configured to receive the first and second latch control signals, and wherein the page buffer includes a sensing control circuit that is configured to receive the first and second latch control signals.

14. The flash memory device of claim 13, wherein the sensing control circuit is configured to receive a potential of the sensing node to output a first signal according to the potential of the sensing node and the first and second latch control signals, and wherein the reference sensing control circuit is configured to receive a potential of the reference sensing node to output a second signal according to the potential of the reference sensing node and the first and second latch control signals.

15. The flash memory device of claim 1, wherein the latch signal generator comprises:

a first NAND gate to output the first latch control signal in response to the reference control signal and a sensing signal;

an inverter to invert a detection signal; and a second NAND gate to output the second latch control signal in response to the first latch control signal and the inverted detection signal.

16. A flash memory device comprising:

a memory cell array to store data, the memory cell array including a drain select transistor coupled to a bit line and a first memory cell having a first gate terminal that is connected to a first word line;

a page buffer to input data to the memory cell array or read data stored in the memory cell array; and a reference memory cell block to store reference data, the reference memory cell block including a reference drain select transistor coupled to a reference bit line and a first reference memory cell having a first gate terminal coupled to the first word line, wherein the reference memory cell block is configured to provide a reference voltage that changes as a bit line voltage changes.

* * * * *